(12) United States Patent
Chang et al.

(10) Patent No.: US 9,923,070 B2
(45) Date of Patent: Mar. 20, 2018

(54) SEMICONDUCTOR STRUCTURE AND MANUFACTURING METHOD THEREOF

(71) Applicant: TAIWAN SEMICONDUCTOR MANUFACTURING CO., LTD., Hsinchu (TW)

(72) Inventors: Che-Cheng Chang, New Taipei (TW); Chih-Han Lin, Hsinchu (TW); Horng-Huei Tseng, Hsinchu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 15/051,595

(22) Filed: Feb. 23, 2016

(65) Prior Publication Data

US 2017/0148885 A1 May 25, 2017

Related U.S. Application Data

(60) Provisional application No. 62/260,146, filed on Nov. 25, 2015.

(51) Int. Cl.
| | | |
|---|---|---|
| *H01L 29/76* | (2006.01) | |
| *H01L 29/417* | (2006.01) | |
| *H01L 29/40* | (2006.01) | |
| *H01L 21/285* | (2006.01) | |
| *H01L 29/66* | (2006.01) | |
| *H01L 29/78* | (2006.01) | |
| H01L 29/49 | (2006.01) | |

(52) U.S. Cl.
CPC .. *H01L 29/41775* (2013.01); *H01L 21/28512* (2013.01); *H01L 29/401* (2013.01); *H01L 29/41791* (2013.01); *H01L 29/66628* (2013.01); *H01L 29/7848* (2013.01); *H01L 29/4966* (2013.01)

(58) Field of Classification Search
CPC ....... H01L 21/823468; H01L 29/66484; H01L 29/6656; H01L 29/7831; H01L 29/0947
USPC .......................................... 257/282, 288, 331
See application file for complete search history.

(56) References Cited

U.S. PATENT DOCUMENTS 9,230,864 B1 * 1/2016 Lu .................... H01L 29/7831
9,502,556 B2 * 11/2016 Wu .................... H01L 29/7833
(Continued)

FOREIGN PATENT DOCUMENTS

| TW | 201030902 A | 8/2010 |
|---|---|---|
| TW | 201413917 A | 4/2014 |

OTHER PUBLICATIONS

Corresponding Taiwan Patent Application 1st Office Action dated Aug. 11, 2017 (4 pgs).

*Primary Examiner* — S. V. Clark
(74) *Attorney, Agent, or Firm* — Cooper Legal Group, LLC

(57) ABSTRACT

A semiconductor structure includes a substrate, at least one first gate structure, at least one first spacer, at least one source drain structure, at least one conductor, and at least one protection layer. The first gate structure is present on the substrate. The first spacer is present on at least one sidewall of the first gate structure. The source drain structure is present adjacent to the first spacer. The conductor is electrically connected to the source drain structure. The protection layer is present between the conductor and the first spacer and on a top surface of the first gate structure.

20 Claims, 5 Drawing Sheets

(56) References Cited

U.S. PATENT DOCUMENTS

2007/0128786 A1* 6/2007 Cheng ............... H01L 21/82380
    438/199
2010/0025771 A1* 2/2010 Hoentschel ....... H01L 21/26506
    257/369

* cited by examiner

SEMICONDUCTOR STRUCTURE AND MANUFACTURING METHOD THEREOF

PRIORITY CLAIM AND CROSS-REFERENCE

This application claims priority to U.S. Provisional Application Ser. No. 62/260,146, filed Nov. 25, 2015, which is herein incorporated by reference.

BACKGROUND

Semiconductor devices are used in a variety of electronic applications, such as personal computers, cell phones, digital cameras, and other electronic equipment, as examples. The semiconductor industry continues to improve the integration density of various electronic components (e.g., transistors, diodes, resistors, capacitors, etc.) by continual reductions in minimum feature size, which allow more components to be integrated into a given area.

The word "interconnection" in integrated circuits means conductive lines which connect the various electronic components. The interconnecting conductive lines are separated from the substrate by insulating layers, except on the contact area. As feature densities increase, the widths of the conductive lines and the spacing between the conductive lines of interconnect structures also scale smaller.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
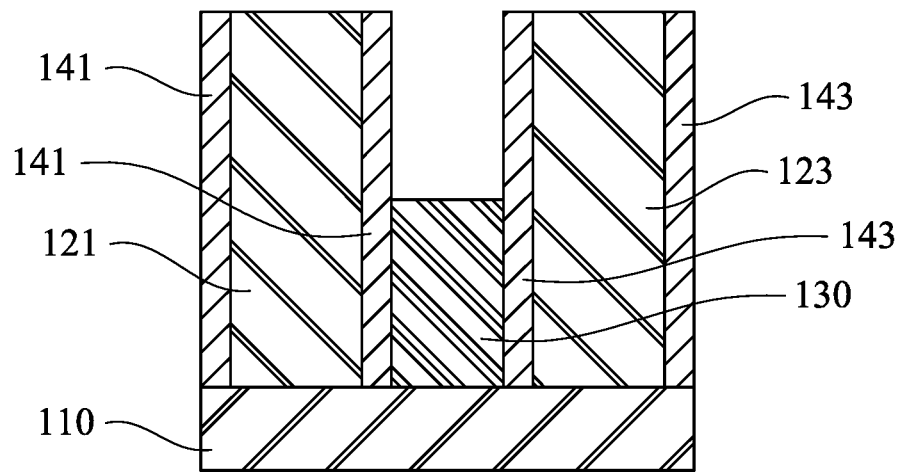
FIGS. 1-9 are cross-sectional views of a method for manufacturing a semiconductor structure at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Unless otherwise defined, all terms (including technical and scientific terms) used herein have the same meaning as commonly understood by the person having ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIGS. 1-9 are cross-sectional views of a method for manufacturing a semiconductor structure at various stages in accordance with some embodiments of the present disclosure.

Reference is made to FIG. 1. A semiconductor structure is formed. The semiconductor structure includes a substrate 110, gate structures 121 and 123, and at least one source drain structure 130. The gate structures 121 and 123 are present on the substrate 110. The source drain structure 130 is present on the substrate 110 and adjacent to the gate structures 121 and 123. In other words, the source drain structure 130 is present between the gate structures 121 and 123. It is note that the numbers of the gate structures 121 and 123 and the number of the source drain structure 130 are illustrative and should not limit various embodiments of the present disclosure. The numbers of the gate structures 121 and 123 and the source drain structure 130 may be determined according to actual situations.

In some embodiments, the substrate 110 may be made of a semiconductor material and may include, for example, a graded layer or a buried oxide therein. In some embodiments, the substrate 110 includes bulk silicon that may be undoped or doped (e.g., p-type, n-type, or combinations thereof). Other materials that are suitable for semiconductor device formation may be used. For example, germanium, quartz, sapphire, and glass could alternatively be used for the substrate 110. Alternatively, the substrate 110 may be an active layer of a semiconductor-on-insulator (SOI) substrate or a multi-layered structure, such as a silicon-germanium layer formed on a bulk silicon layer.

In some embodiments, at least one stack of a gate dielectric layer, a diffusion barrier layer, a metal layer, a block layer, a wetting layer, and filling metal form at least one of the gate structures 121 and 123. In other words, at least one of the gate structures 121 and 123 may include the stack of the gate dielectric layer, the diffusion barrier layer, the metal layer, the block layer, the wetting layer, and the filling metal.

In some embodiments, the gate dielectric layer includes an interfacial layer (IL, the lower part of the gate dielectric layer), which is a dielectric layer. In some embodiments, the IL includes an oxide layer, such as a silicon oxide layer, which may be formed through a thermal oxidation of the substrate 110, a chemical oxidation, or a deposition step. The gate dielectric layer may also include a high-k dielectric layer (the upper part of the gate dielectric layer) including a high-k dielectric material, such as hafnium oxide, lanthanum oxide, aluminum oxide, or combinations thereof. The dielectric constant (k-value) of the high-k dielectric material is higher than about 3.9, and may be higher than about 7, and sometimes as high as about 21 or higher. The high-k dielectric layer is overlying, and may contact, the IL.

In some embodiments, the diffusion barrier layer includes TiN, TaN, or combinations thereof. For example, the diffusion barrier layer may include a TiN layer (the lower part of the diffusion barrier layer) and a TaN layer (the upper part of the diffusion barrier layer) over the TiN layer.

When one of the gate structures 121 and 123 forms an n-type metal-oxide-semiconductor (MOS) device, the metal layer is in contact with the diffusion barrier layer. For example, in the embodiments in which the diffusion barrier layer includes a TiN layer and a TaN layer, the metal layer may be in physical contact with the TaN layer. In alternative embodiments in which one of the gate structures 121 and 123 forms a p-type MOS device, an additional TiN layer is formed between, and in contact with, the TaN layer (in the diffusion barrier layer) and the overlaying metal layer. The additional TiN layer provides the work function suitable for the pMOS device, which work function is higher than the mid-gap work function (about 4.5 eV) that is in the middle of the valance band and the conduction band of silicon. The work function higher than the mid-gap work function is referred to as a p-work function, and the respective metal having the p-work function is referred to as a p-metal.

The metal layer provides the work function suitable for the nMOS device, which work function is lower than the mid-gap work function. The work function lower than the mid-gap work function is referred to as an n-work function, and the respective metal having the n-work function may be referred to as an n-metal. In some embodiments, the metal layer is an n-metal having a work function lower than about 4.3 eV. The work function of the metal layer may also be in a range from about 3.8 eV to about 4.6 eV. The metal layer may include titanium aluminum (TiAl) (which may include, or free from or substantially free from other elements) in accordance with some embodiments. The formation of the metal layer may be achieved through physical vapor deposition (PVD). In accordance with some embodiments of the present disclosure, the metal layer is formed at room temperature (for example, from about 20° C. to about 25° C.). In alternative embodiments, the metal layer is formed at an elevated temperature higher than the room temperature, for example, higher than about 200° C.

The block layer may include TiN in some embodiments. The block layer may be formed using atomic layer deposition (ALD).

The wetting layer has an ability to adhere (and wet) the subsequently formed filling metal during the reflow of the filling metal. In some embodiments, the wetting layer is a cobalt layer, which may be formed using atomic layer deposition (ALD) or chemical vapor deposition (CVD).

The filling metal may include aluminum, an aluminum alloy (e.g., titanium aluminum), tungsten, or copper, which may also be formed using physical vapor deposition (PVD), chemical vapor deposition (CVD), or the like. The filling metal may be reflowed. The formation of the wetting layer improves the wetting of the filling metal to the underlying layers.

The source drain structure 130 may be formed by doping impurities into at least one active semiconductor fin, which is formed by, for example, patterning and etching the substrate 110 using photolithography techniques. In some embodiments that the resulting MOS device is an nMOS device, n-type impurities such as phosphorous or arsenic may be doped in the source drain structure 130. In some other embodiments that the resulting MOS device is a pMOS device, p-type impurities such as boron or $BF_2$ may be doped in the source drain structure 130.

Alternatively, the source drain structure 130 may be formed by, for example, epitaxial growth. In some embodiments, the source drain structure 130 may function as a source drain stressor to enhance carrier mobility of the semiconductor device and the device performance. The source drain structure 130 may be formed using a cyclic deposition and etching (CDE) process. The CDE process includes an epitaxial deposition/partial etch process and repeating the epitaxial deposition/partial etch process at least once.

In some embodiments that the resulting MOS device is an nMOS device, the source drain structure 130 may be an n-type epitaxy structure. In some embodiments that the resulting MOS device is a pMOS device, the source drain structure 130 may be a p-type epitaxy structure. The n-type epitaxy structure may be made of SiP, SiC, SiPC, Si, III-V compound semiconductor materials or combinations thereof, and the p-type epitaxy structure may be made of SiGe, SiGeC, Ge, Si, III-V compound semiconductor materials, or combinations thereof. During the formation of the n-type epitaxy structure, n-type impurities such as phosphorous or arsenic may be doped with the proceeding of the epitaxy. For example, when the n-type epitaxy structure includes SiP or SiC, n-type impurities are doped. Moreover, during the formation of the p-type epitaxy structure, p-type impurities such as boron or $BF_2$ may be doped with the proceeding of the epitaxy. For example, when the p-type epitaxy structure includes SiGe, p-type impurities are doped. The epitaxy processes include CVD deposition techniques (e.g., vapor-phase epitaxy (VPE) and/or ultra-high vacuum CVD (UHV-CVD)), molecular beam epitaxy, and/or other suitable processes. The source drain structure 130 may be in-situ doped. If the source drain structure 130 is not in-situ doped, a second implantation process (i.e., a junction implant process) is performed to dope the source drain structure 130. One or more annealing processes may be performed to activate the source drain structure 130. The annealing processes include rapid thermal annealing (RTA) and/or laser annealing processes.

In addition, spacers 141 are present on sidewalls of the gate structure 121, and spacers 143 are present on sidewalls of the gate structure 123. In some embodiments, at least one of the spacers 140 and 143 include one or more layers, including silicon nitride, silicon oxynitride, silicon oxide, or other dielectric materials. The available formation methods include plasma enhanced chemical vapor deposition (PECVD), low-pressure chemical vapor deposition (LP-CVD), sub-atmospheric chemical vapor deposition (SACVD), and other deposition methods.

Figure 2:
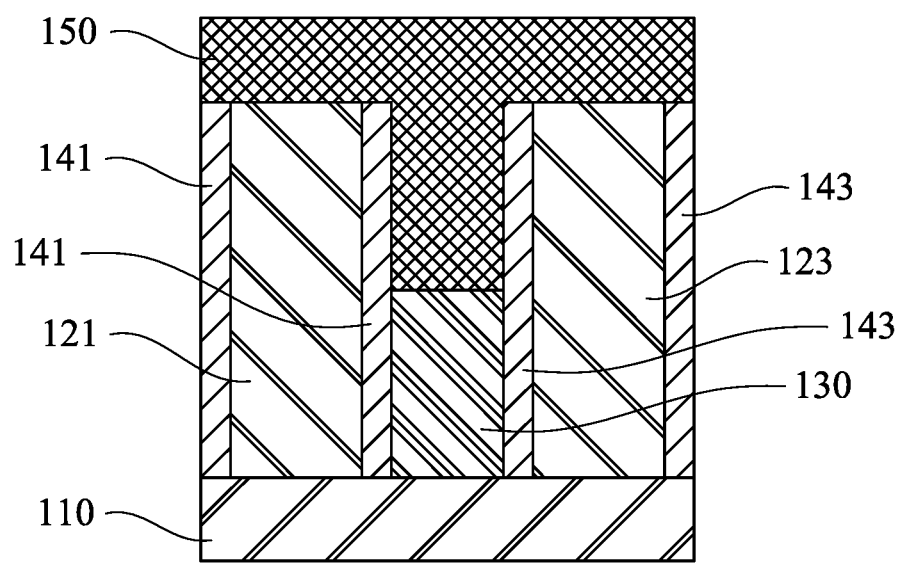

Reference is made to FIG. 2. A dielectric layer 150 is formed on the gate structures 121 and 123 and the source drain structure 130, and at least a portion of the dielectric layer 150 is present between the gate structures 121 and 123 and on the source drain structure 130. The dielectric layer 150 is an interlayer dielectric (ILD) layer. The dielectric layer 150 is made of a dielectric material, such as silicon oxide, silicon nitride, silicon oxynitride, or combinations thereof. In some embodiments, the dielectric layer 150 is made of a low-κ dielectric material to improve resistive-capacitive (RC) delay. The dielectric constant of the low-κ dielectric material is lower than that of silicon dioxide ($SiO_2$). One approach to reduce the dielectric constant of a dielectric material is to introduce carbon (C) or fluorine (F) atoms. For example, in $SiO_2$ (κ=3.9), the introduction of C atoms to form hydrogenated carbon-doped silicon oxide (SiCOH) (κ is between 2.7 and 3.3) and the introduction of F atoms to form fluorosilicate glass (FSG) (κ is between 3.5 and 3.9) reduces its dielectric constant. In some embodiments, the low-κ dielectric material is, for example, nanopore carbon doped oxide (CDO), black diamond (BD), a benzocyclobutene (BCB) based polymer, an aromatic (hydrocarbon) thermosetting polymer (ATP), hydrogen silsesquioxane (HSQ), methyl silsesquioxane (MSQ), poly-arylene ethers (PAE), diamond-like carbon (DLC) doped with nitrogen, or combinations thereof. The dielectric layer 150 is formed by, for example, chemical vapor deposition (CVD), spin coating, or combinations thereof.

Figure 3:
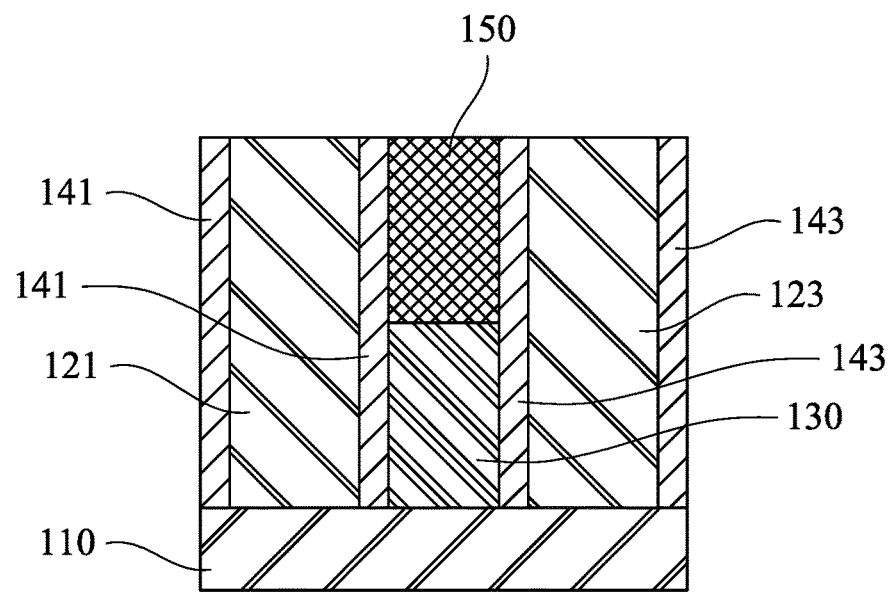

As shown in FIG. 2 and FIG. 3, the dielectric layer 150 above the gate structures 121 and 123 is removed through a removal process. In some embodiments, the portion of the dielectric layer 150 is removed by a chemical mechanical polishing (CMP) process. After the CMP process, the residual dielectric layer 150 is present on the source drain structure 130 and between the gate structures 121 and 123.

Figure 4:
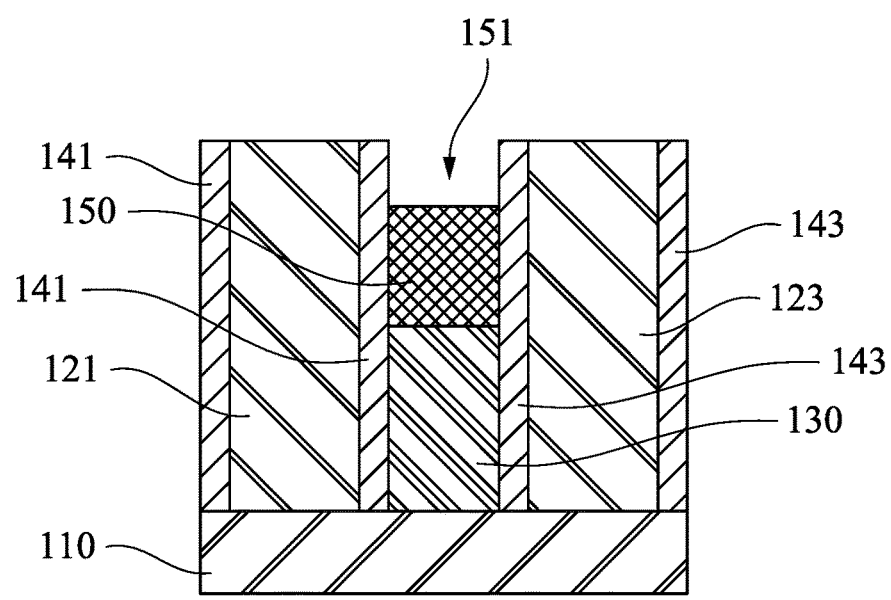

Reference is made to FIG. 4. An upper portion of the residual dielectric layer 150 is removed, such that the dielectric layer 150, the gate structures 121 and 123, and the spacers 141 and 143 form a recess 151. At least portions of the spacers 141 and 143 are exposed by the recess 151. The upper portion of the dielectric layer 150 is removed by an etching process. The etching of the dielectric layer 150 may be dry etching, such as reactive ion etching (RIE), plasma enhanced (PE) etching, or inductively coupled plasma (ICP) etching. In some embodiments, when the dielectric layer 150 is made of silicon oxide, fluorine-based RIE can be used to form the recess 151. The gas etchant used to dry etch the dielectric layer 150 is, for example, $CF_4/O_2$.

Specifically, a depth of the recess 151 is in a range from about 5 Å to 500 Å. Embodiments of this disclosure are not limited thereto.

Figure 5:
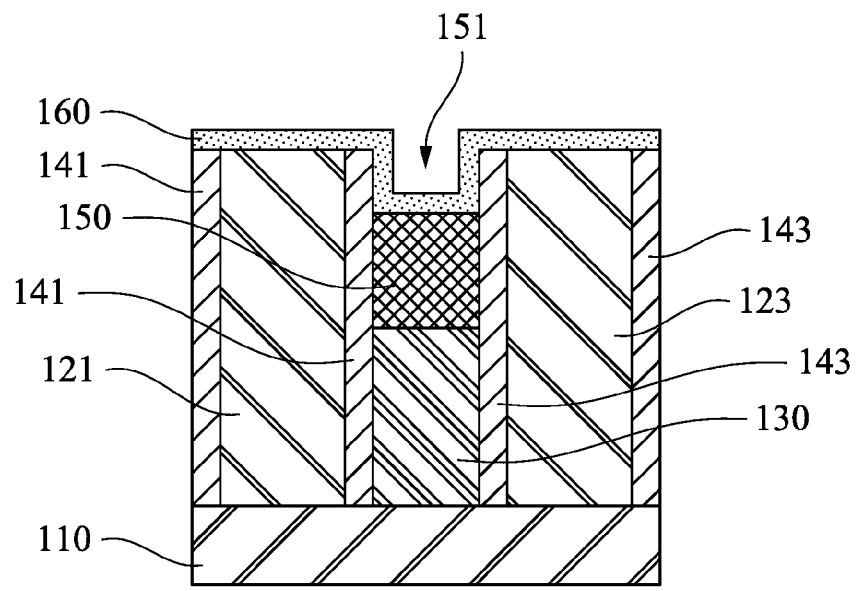

Reference is made to FIG. 5. A protection layer 160 is formed on top surfaces of the gate structures 121 and 123, at least one sidewall of the recess 151 (i.e., at least portions of the exposed spacers 141 and 143), and a bottom surface of the recess 151 (i.e., a top surface of the dielectric layer 150 on the source drain structure 130). The protection layer 160 may include, for example, silicon nitride, silicon oxynitride, or the like. The protection layer 160 may be formed using atomic layer deposition (ALD), other suitable processes, or combinations thereof.

Figure 6:
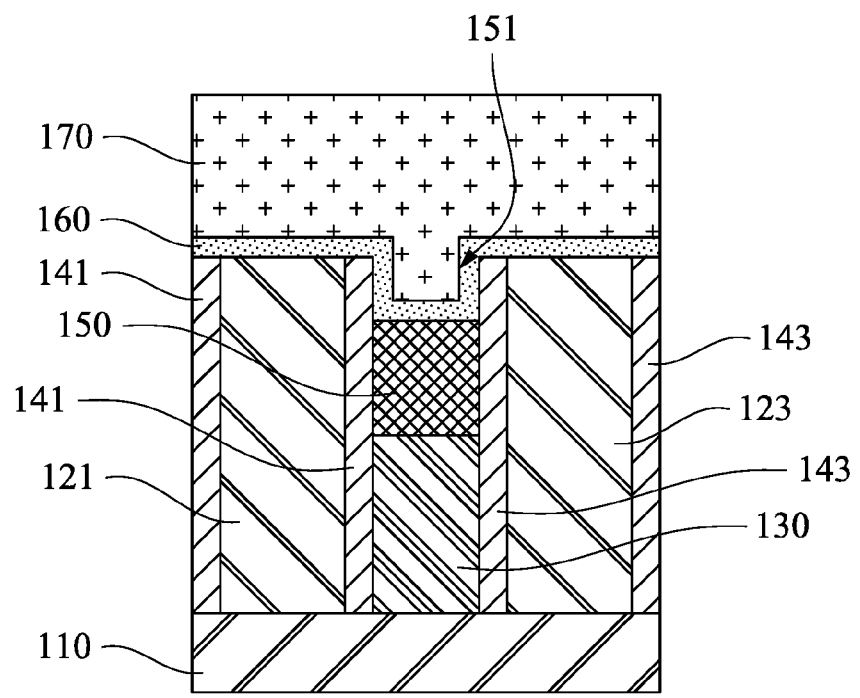

In FIG. 6, a dielectric layer 170 is formed on the gate structures 121 and 123, the protection layer 160, and the dielectric layer 150. The dielectric layer 170 is an interlayer dielectric (ILD) layer. The dielectric layer 170 is made of a dielectric material, such as silicon oxide, silicon nitride, silicon oxynitride, or combinations thereof. In some embodiments, the dielectric layer 170 is made of a low-κ dielectric material to improve resistive-capacitive (RC) delay. The dielectric constant of the low-κ dielectric material is lower than that of silicon dioxide ($SiO_2$). In some embodiments, the low-κ dielectric material is, for example, hydrogenated carbon-doped silicon oxide (SiCOH), fluorosilicate glass (FSG), nanopore carbon doped oxide (CDO), black diamond (BD), a benzocyclobutene (BCB) based polymer, an aromatic (hydrocarbon) thermosetting polymer (ATP), hydrogen silsesquioxane (HSQ), methyl silsesquioxane (MSQ), poly-arylene ethers (PAE), diamond-like carbon (DLC) doped with nitrogen, or combinations thereof. The dielectric layer 170 is formed by, for example, chemical vapor deposition (CVD), spin coating, or combinations thereof.

Figure 7:
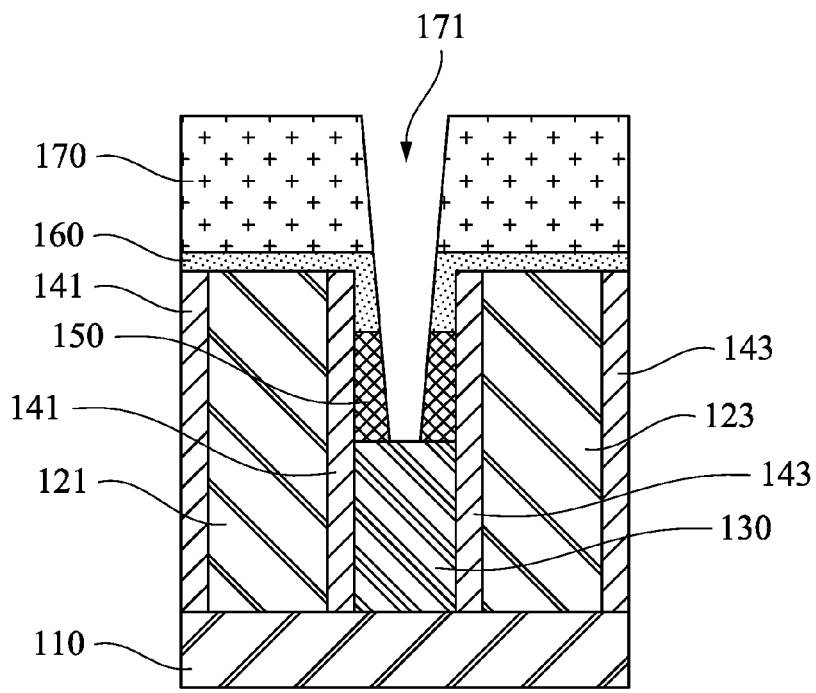

Reference is made to FIG. 6 and FIG. 7. A hole 171 is formed in the dielectric layers 150 and 170 to expose the source drain structure 130, and a portion of the protection layer 160 on the bottom surface of the recess 151 is removed when the hole 171 is formed. At least one portion of the protection layer 160 is exposed by the hole 171. The hole 171 is formed by a photolithography and etching process. The photolithography and etching process includes photoresist application, exposure, developing, etching, and photoresist removal. A photoresist is applied onto the dielectric layer 170 by, for example, spin coating. The photoresist is then prebaked to drive off excess photoresist solvent. After prebaking, the photoresist is exposed to a pattern of intense light.

The intense light is, for example, a G-line with a wavelength of about 436 nm, an I-line with a wavelength of about 365 nm, a krypton fluoride (KrF) excimer laser with a wavelength of about 248 nm, an argon fluoride (ArF) excimer laser with a wavelength of about 193 nm, a fluoride ($F_2$) excimer laser with a wavelength of about 157 nm, or combinations thereof. A space between the final lens of the exposure tool and the photoresist surface may be filled with a liquid medium that has a refractive index greater than one during the exposure to enhance the photolithography resolution. The exposure to light causes a chemical change that allows some of the photoresist soluble in a photographic developer.

Then, a post-exposure bake (PEB) may be performed before developing to help reduce standing wave phenomena caused by the destructive and constructive interference patterns of the incident light. The photographic developer is then applied onto the photoresist to remove the some of the photoresist soluble in the photographic developer. The remaining photoresist is then hard-baked to solidify the remaining photoresist.

At least one portion of the dielectric layer 170 which is not protected by the remaining photoresist is etched to form the hole 171. The etching of the dielectric layer 170 may be dry etching, such as reactive ion etching (RIE), plasma enhanced (PE) etching, or inductively coupled plasma (ICP) etching. In some embodiments, when the dielectric layer 170 is made of silicon oxide, fluorine-based RIE can be used to form the hole 171. The gas etchant used to dry etch the dielectric layer 170 is, for example, $CF_4/O_2$.

After the hole 171 is formed, the photoresist is removed from the dielectric layer 170 by, for example, plasma ashing, stripping, or combinations thereof. Plasma ashing uses a plasma source to generate a monatomic reactive species, such as oxygen or fluorine. The reactive species combines with the photoresist to form ash which is removed with a vacuum pump. Stripping uses a photoresist stripper, such as acetone or a phenol solvent, to remove the photoresist from the dielectric layer 170.

In addition, after the hole 171 is formed, at least a portion of the residual dielectric layer 150 is present on the sidewall of the hole 171. Specifically, the portion of the residual dielectric layer 150 on the sidewall of the hole 171 is present on the spacers 141 and 143 on the sidewalls of the gate structures 121 and 123.

Figure 8:
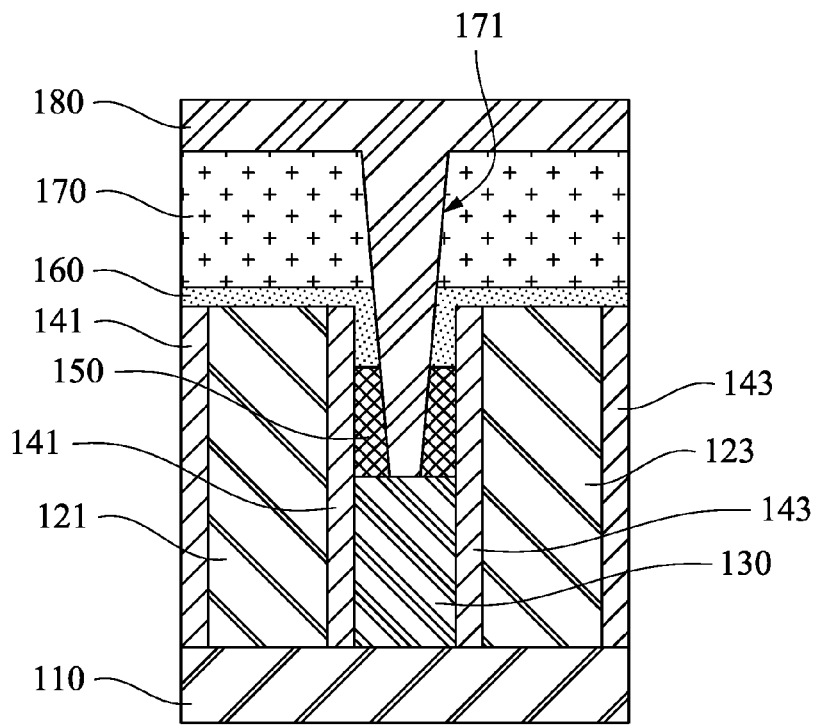

Reference is made to FIG. 8, a conductive layer 180 overfills the hole 171. The conductive layer 180 is made of metal, such as copper (Cu), aluminum (Al), tungsten (W), nickel (Ni), cobalt (Co), titanium (Ti), platinum (Pt), tantalum (Ta), or combinations thereof. The conductive layer 180 is formed by, for example, electrochemical deposition, physical vapor deposition (PVD), chemical vapor deposition (CVD), or combinations thereof.

Figure 9:
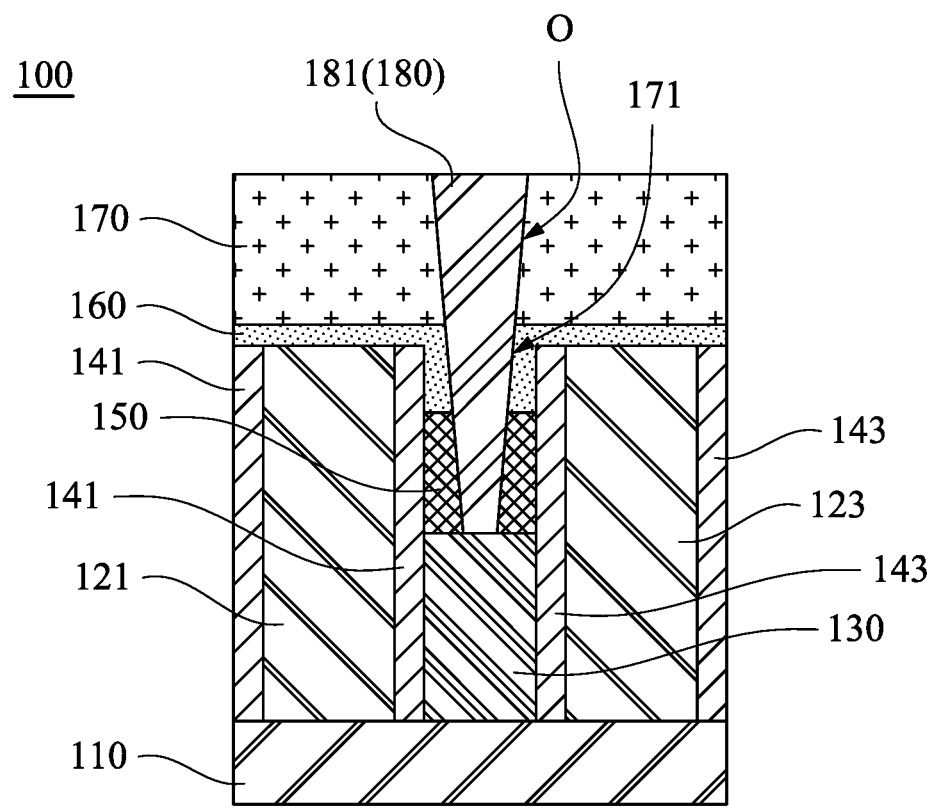

Then, as shown in FIG. 8 and FIG. 9, the excess conductive layer 180 outside of the hole 171 is removed. The excess conductive layer 180 outside of the hole 171 is removed through a removal process. In some embodiments, the conductive layer 180 over burden is removed by a chemical mechanical polishing (CMP) process. In some embodiments, when the conductive layer 180 is made of copper (Cu), the CMP slurry is made of, for example, a mixture of suspended abrasive particles, an oxidizer, and a corrosion inhibitor, and the CMP slurry is acidic. After the CMP process, a conductor 181 (the conductive layer 180) is formed in the hole 171. The conductor 181 is electrically connected to the source drain structure 130, and the protection layer 160 is present between the conductor 181 and the spacer 141 and between the conductor 181 and the spacer 143.

In another aspect of the present disclosure, a semiconductor structure 100 is provided. The semiconductor structure 100 includes a substrate 110, gate structures 121 and 123, spacers 141 and 143, at least one source drain structure 130, at least one conductor 181, and at least one protection layer 160. The gate structures 121 and 123 are present on the substrate 110. The spacer 141 is present on at least one sidewall of the gate structure 121, and the spacer 143 is present on at least one sidewall of the gate structure 123. The source drain structure 130 is present on the substrate 110 and adjacent to the spacers 141 and 143, and the source drain structure 130 is present between the spacers 141 and 143. The conductor 181 is electrically connected to the source drain structure 130. The protection layer 160 is present between the conductor 181 and the spacer 141 and between the conductor 181 and the spacer 143 and on top surfaces of the gate structures 121 and 123.

Specifically, the protection layer 160 is made of a dielectric material, such as silicon nitride, silicon oxynitride, or combinations thereof. Embodiments of this disclosure are not limited thereto.

Specifically, a distance between a top surface and a bottom surface of a portion of the protection layer 160 between the spacer 141 and the conductor 181 is in a range from about 5 Å to 500 Å. A distance between a top surface and a bottom surface of a portion of the protection layer 160 between the spacer 143 and the conductor 181 is in a range from about 5 Å to 500 Å. Embodiments of this disclosure are not limited thereto.

The semiconductor structure 100 further includes a dielectric layer 170. The dielectric layer 170 is present at least on the protection layer 160 and has an opening O at least therein. The source drain structure 130 is exposed through the opening O, and at least a portion of the conductor 181 is present in the opening O. The conductor 181 is electrically connected to the source drain structure 130 at least through the opening O. In addition, the protection layer 160 is absent in the opening O of the dielectric layer 170, and the protection layer 160 is present between the dielectric layer 170 and the gate structure 121 and between the dielectric layer 170 and the gate structure 123.

The semiconductor structure 100 further includes a dielectric layer 150. The dielectric layer 150 is present between the conductor 181 and the spacer 141 and between the conductor 181 and the spacer 143. The protection layer 160 is present above the dielectric layer 150. That is, the dielectric layer 150 is present between the protection layer 160 and the source drain structure 130.

The source drain structure 130 may include at least one source drain stressor. Embodiments of this disclosure are not limited thereto.

The protection layer 160 can protect the spacers 141 and 143 from being over-etched during the forming the hole 171. Therefore, after formation of the conductor 181, the conductor 181 can be electrically isolated from the gate structures 121 and 123 without causing short circuit failures and/or the leakage problem. With the protection layer 160, the device size can be further reduced without putting a heavy load on the photolithography and etching process, and thus the device performance can be improved. Furthermore, the overlay and pattern loading requirements can be loosened. In addition, the protection layer 160 can enlarge the process window for contact hole formation and improve in-line control in the semiconductor device fabrication process. Therefore, the reliability and/or the yield in fabricating the semiconductor devices can be improved.

According to some embodiments of the present disclosure, a semiconductor structure includes a substrate, at least one first gate structure, at least one first spacer, at least one source drain structure, at least one conductor, and at least one protection layer. The first gate structure is present on the substrate. The first spacer is present on at least one sidewall of the first gate structure. The source drain structure is present adjacent to the first spacer. The conductor is electrically connected to the source drain structure. The protection layer is present between the conductor and the first spacer and on a top surface of the first gate structure.

According to some embodiments of the present disclosure, a semiconductor structure includes a substrate, at least one gate structure, at least one spacer, at least one source drain structure, at least one first dielectric layer, and at least one protection layer. The gate structure is present on the substrate. The spacer is present on at least one sidewall of the gate structure. The source drain structure is present on the substrate. The first dielectric layer is present at least on the gate structure and has an opening therein, and the source drain structure is exposed through the opening. The conductor is electrically connected to the source drain structure at least through the opening. The protection layer is present between the conductor and the spacer and between the first dielectric layer and the gate structure.

According to some embodiments of the present disclosure, a method for manufacturing a semiconductor structure includes the following operations. A first dielectric layer is formed on at least one source drain structure and between at least one first gate structure and at least one second gate structure. An upper portion of the first dielectric layer is removed, such that the first dielectric layer, the first gate structure, and the second gate structure form a recess. A protection layer is formed at least on at least one sidewall of the recess. A second dielectric layer is formed on the first gate structure, the second gate structure, the protection layer, and the first dielectric layer. A hole is formed in the first dielectric layer and the second dielectric layer. A conductor is formed in the hole, in which the conductor is electrically connected to the source drain structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a substrate;
    a first gate structure present on the substrate;
    a first spacer present on a sidewall of the first gate structure;
    a source/drain structure present adjacent to the first spacer;
    a conductor electrically connected to the source/drain structure;
    a protection layer present between the conductor and the first spacer and present on a top surface of the first gate structure;
    a first dielectric layer present between the conductor and the first spacer and between the protection layer and the source/drain structure; and
    a second dielectric layer present on the protection layer, wherein the second dielectric layer has an opening therein and at least a portion of the conductor is present in the opening.

2. The semiconductor structure of claim 1, wherein the protection layer is made of silicon nitride, silicon oxynitride, or combinations thereof.

3. The semiconductor structure of claim 1, further comprising:
    a second gate structure present on the substrate; and
    a second spacer present on a sidewall of the second gate structure, wherein the source/drain structure is present between the first spacer and the second spacer.

4. The semiconductor structure of claim 3, wherein the protection layer is further present between the conductor and the second spacer and present on a top surface of the second gate structure.

5. The semiconductor structure of claim 1, wherein the first dielectric layer and the second dielectric layer are made of substantially the same material.

6. The semiconductor structure of claim 1, wherein the protection layer and the first dielectric layer are made of different materials.

7. A semiconductor structure, comprising:
    a substrate;
    a gate structure present on the substrate;
    a spacer present on a sidewall of the gate structure;
    a source/drain structure present on the substrate;
    a first dielectric layer present on the gate structure and having an opening therein, wherein the source/drain structure is exposed through the opening;
    a conductor electrically connected to the source/drain structure through the opening; and
    a protection layer present between the conductor and the spacer and between the first dielectric layer and the gate structure, wherein the protection layer is absent in the opening of the first dielectric layer.

8. The semiconductor structure of claim 7, further comprising:
    a second dielectric layer present between the conductor and the spacer, wherein the protection layer is present above the second dielectric layer.

9. The semiconductor structure of claim 8, wherein the protection layer and the second dielectric layer are made of different materials.

10. The semiconductor structure of claim 7, wherein the protection layer is made of silicon nitride, silicon oxynitride, or combinations thereof.

11. A semiconductor structure, comprising:
    a substrate;
    a first gate structure present on the substrate;
    a first spacer present on a sidewall of the first gate structure;
    a source/drain structure present adjacent to the first spacer;
    a conductor electrically connected to the source/drain structure;
    a protection layer present between the conductor and the first spacer and present on a top surface of the first gate structure; and
    a first dielectric layer present between the conductor and the first spacer and between the protection layer and the source/drain structure, wherein the protection layer and the first dielectric layer are made of different materials.

12. The semiconductor structure of claim 11, wherein the conductor is in contact with a sidewall of the protection layer and a sidewall of the first dielectric layer.

13. The semiconductor structure of claim 11, wherein the first spacer is present between the first gate structure and the source/drain structure.

14. The semiconductor structure of claim 11, wherein the first dielectric layer is in contact with a sidewall of the first spacer.

15. The semiconductor structure of claim 14, wherein the protection layer is in contact with the sidewall of the first spacer.

16. The semiconductor structure of claim 11, wherein the protection layer is in contact with a sidewall of the first spacer.

17. The semiconductor structure of claim 11, wherein the source/drain structure is in contact with a sidewall of the first spacer.

18. The semiconductor structure of claim 11, further comprising a second dielectric layer present on the protection layer.

19. The semiconductor structure of claim 18, wherein the conductor is in contact with a sidewall of the second dielectric layer.

20. The semiconductor structure of claim 18, wherein the second dielectric layer overlies the protection layer and the first dielectric layer.

* * * * *